(12) United States Patent
Achkir et al.

(10) Patent No.: US 8,963,573 B2
(45) Date of Patent: Feb. 24, 2015

(54) UNIVERSAL TEST SYSTEM FOR TESTING ELECTRICAL AND OPTICAL HOSTS

(75) Inventors: D. Brice Achkir, San Jose, CA (US); Marco Mazzini, Sesto San Giovanni (IT); Stefano Riboldi, Milan (IT); Cristiana Muzio, Ivrea (IT)

(73) Assignee: Cisco Technology, Inc., San Jose, CA (US)

( * ) Notice: Subject to any disclaimer, the term of this patent is extended or adjusted under 35 U.S.C. 154(b) by 447 days.

(21) Appl. No.: 13/335,661

(22) Filed: Dec. 22, 2011

(65) Prior Publication Data
US 2013/0162279 A1    Jun. 27, 2013

(51) Int. Cl.
*G01R 31/00* (2006.01)
*G01R 1/067* (2006.01)
*H04L 1/24* (2006.01)
*G01R 31/3185* (2006.01)

(52) U.S. Cl.
CPC .............. *G01R 1/067* (2013.01); *H04L 1/243* (2013.01); *G01R 31/3185* (2013.01); *H04L 1/241* (2013.01)
USPC . 324/756.02; 324/523; 324/527; 324/756.01; 324/750.3; 324/750.18; 370/241; 370/242; 398/16; 398/22

(58) Field of Classification Search
CPC ............ G01R 1/067; G01R 1/20; G01R 1/28; G01R 31/00; G01R 31/2889; G01R 31/30; G01R 31/2801; G01R 31/3185; G01R 31/318502; G01R 31/318505; G01R 31/311; H04J 3/14; H04B 10/40; H04B 10/67; H04B 10/2504; H04B 17/002
USPC ............ 324/756.02, 523, 527, 756.01, 750.3, 324/750.15, 750.18, 750, 763, 764; 370/241–253; 398/16, 17, 22–24, 135
See application file for complete search history.

(56) References Cited

U.S. PATENT DOCUMENTS

| | | | |
|---|---|---|---|
| 5,179,302 A | 1/1993 | Wagner | |
| 5,671,252 A | 9/1997 | Kovacs et al. | |
| 5,774,505 A | 6/1998 | Baugh | |
| 5,940,441 A | 8/1999 | Cranford, Jr. et al. | |
| 6,069,522 A | 5/2000 | Venkatraman et al. | |

(Continued)

FOREIGN PATENT DOCUMENTS

| | | |
|---|---|---|
| CN | 201584986 U | 9/2010 |
| EP | 0808046 A2 | 11/1997 |

(Continued)

OTHER PUBLICATIONS

U.S. Appl. No. 12/054,361 Notice of Allowance mailed Jan. 5, 2012, 10 pages.

(Continued)

*Primary Examiner* — Huy Q Phan
*Assistant Examiner* — Thang Le

(57) ABSTRACT

According to an example implementation, a universal tester includes a host interface slot connected to a first pluggable host card during an electrical test mode of operation to provide a stressed electrical signal to a host under test. The host interface slot is connected to a second pluggable host card during an optical test mode of operation, the second pluggable host card including an electrical-optical conversion block to convert a stressed electrical signal to a stressed optical signal that is provided to a host under test. A stressor generator may operation in pass-through mode or a loop-back mode.

31 Claims, 4 Drawing Sheets

(56) References Cited

U.S. PATENT DOCUMENTS

| | | | |
|---|---|---|---|
| 6,144,697 | A | 11/2000 | Gelfand et al. |
| 6,233,107 | B1 | 5/2001 | Minuhin |
| 6,285,709 | B1 | 9/2001 | Alelyunas et al. |
| 6,446,867 | B1 | 9/2002 | Sanchez |
| 6,801,307 | B2 | 10/2004 | Ziegler et al. |
| 6,968,167 | B1 | 11/2005 | Wu et al. |
| 6,968,168 | B1 | 11/2005 | Collier et al. |
| 7,016,406 | B1 | 3/2006 | Phanse et al. |
| 7,054,606 | B1 | 5/2006 | Sheng et al. |
| 7,302,461 | B2 | 11/2007 | Mukherjee et al. |
| 7,471,897 | B1 | 12/2008 | Theodoras, II et al. |
| 7,522,847 | B2 | 4/2009 | Momtaz et al. |
| 7,723,995 | B2 * | 5/2010 | Arguelles et al. ............ 324/537 |
| 8,406,142 | B2 * | 3/2013 | Noble et al. ................. 370/241 |
| 8,583,395 | B2 * | 11/2013 | Dybsetter et al. ............ 702/119 |
| 2004/0044713 | A1 | 3/2004 | Healey et al. |
| 2004/0071389 | A1 * | 4/2004 | Hofmeister et al. ............ 385/16 |
| 2004/0083192 | A1 | 4/2004 | Elliott |
| 2004/0151268 | A1 | 8/2004 | Hidaka |
| 2005/0019042 | A1 | 1/2005 | Kaneda et al. |
| 2005/0024151 | A1 | 2/2005 | Chuan |
| 2005/0123036 | A1 | 6/2005 | Rahman et al. |
| 2005/0265717 | A1 | 12/2005 | Zhou |
| 2006/0133813 | A1 | 6/2006 | Ekkizogloy et al. |
| 2006/0189220 | A1 | 8/2006 | Duval et al. |
| 2007/0036084 | A1 | 2/2007 | Lindsay et al. |
| 2007/0272041 | A1 * | 11/2007 | Bench et al. ................. 73/865.6 |
| 2008/0044141 | A1 | 2/2008 | Willis et al. |
| 2008/0063395 | A1 * | 3/2008 | Royle et al. ..................... 398/16 |
| 2008/0232397 | A1 | 9/2008 | Muth |
| 2009/0028574 | A1 * | 1/2009 | Dybsetter et al. ............ 398/135 |
| 2010/0111539 | A1 * | 5/2010 | Aronson et al. ............. 398/135 |
| 2010/0241906 | A1 | 9/2010 | Thompson et al. |
| 2011/0293285 | A1 * | 12/2011 | Aronson et al. ............. 398/135 |
| 2012/0051735 | A1 * | 3/2012 | Achkir et al. .................... 398/16 |
| 2013/0073749 | A1 * | 3/2013 | Tremblay et al. .............. 710/16 |
| 2013/0145212 | A1 * | 6/2013 | Hsu et al. ........................ 714/27 |

FOREIGN PATENT DOCUMENTS

| | | |
|---|---|---|
| EP | 1684446 A2 | 7/2006 |
| WO | 02/13424 A2 | 2/2002 |
| WO | 2012026951 A1 | 3/2012 |

OTHER PUBLICATIONS

International Search Report and Written Opinion in counterpart International Application No. PCT/US2012/070248, mailed Apr. 5, 2013.
"CFP MSA Hardware Specification", CFP MSA, Revision 1.4, Opnext, Inc., Jun. 7, 2010, pp. 1-53.
"CFP MSA Management Interface Specification", CFP, 100/40 Gigabit Transceiver Package Multi-Source Agreement, Version 1.4, Jun. 22, 2010, pp. 1-90.
"CFP MSA Mechanical Layout", Tyco Electronics, Revision 14, Mar. 17, 2010, pp. 1-19.
"CFP MSA Module Dimensions", CFP Module, Apr. 7, 2010, 2 pages.
"Operating Rules for the CFP MSA", CFP MSA, A Cooperation Agreement for 100/40 Gigabit Ethernet Transceiver Package, Issue 1.1, Modified Sections 8.2, 11.3 and 11.4, Apr. 10, 2009, pp. 1-10.
Non-Final Office Action Response filed for U.S. Appl. No. 12/054,361, filed Sep. 9, 2011, 13 pages.
Non-Final Office Action received for U.S. Appl. No. 12/054,361, mailed on Mar. 16, 2010, 20 pages.
Spilman, Antony, "A Cooperation Agreement for 10 Gigabit Ethernet Transceiver Package", Xenpak SA, Revision 3.0, Issue 3.0, Sep. 18, 2002, pp. 1-77.
Snively, Robert, et al., "INF-8077I 10 Gigabit Small Form Factor Pluggable Module", INF-8077i, Revision 4.5, Saratoga, CA USA, Aug. 31, 2005, pp. 1-192.
Mazzini, Marco, et al., "SFP+ Interoperability Demonstration White Paper", Ethernet alliance, Version 1.0, Sep. 2008, pp. 1-18.
Non-Final Office Action received for U.S. Appl. No. 12/054,361, mailed on Nov. 10, 2010, 27 pages.
Non-Final Office Action received for U.S. Appl. No. 12/054,361, mailed on Jun. 9, 2011, 26 pages.
"Hydra Modular Test Systems: Circadiant Products, SFF-8431 SFP+ Electrical/Optical Comopliance System for Module, Host Card and IC Testing Applications", Retrieved on Mar. 16, 2008, pp. 1-2. Available at: www.circadiant.com/products/Hydra/SFP+/.
Part 3: Carrier Sense Multiple Access with Collision Detection (CSMA/CD) Access Method, IEEE Standard for Information Technology, Telecommunications and Information Exchange Between Systems, Local and Metropolitan Area Networks, Specific Requirements, IEEE Std 802.3aq-2006, 2006, pp. 1-62.
"SFF Committee, INF-8074i, Specification for SFP (Small Formfactor Pluggable) Transceiver", Revision 1.0, SFF Committee, May 12, 2001, pp. 1-38.
"SFF-8431 Specifications for Enhanced 8.5 and 10 Gigabit Small Form Factor Pluggable Module "SFP+"", Revision 1.3, SFF Committee, Feb. 16, 2007, pp. 1-92.
"Small Form-Factor Pluggable Transceiver", Wikipedia, Retrieved on Mar. 16, 2008, pp. 1-3. Available at: www.wikipedia.com/wiki/Small_form-factor_pluggable_transceiver.
"Technology/Market Watch", Nexans, Data Communications Competence Center, DCCC07082801, Aug. 2007, pp. 1-9.
Balasubramonian, V., et al., "SFP+ Direct Attach Copper Interoperability Demonstration White Paper", Ethernet Alliance, Jul. 28, 2010, pp. 1-19.
Clark, Randy, et al., "SFF-8472 Diagnostic Monitoring Interface for Optical Transceivers", SFF-8472, Revision 10.2, Jun. 1, 2007, pp. 1-36.
Garrido, N.D.F. et al., "A comparative study of two adaptive continuous-time filters for decision feedback equalization read channels", Proceedings of 1997 IEEE International Symposium on Circuits and Systems, ISCAS '97, vol. 1, Jun. 9-12, 1997, pp. 89-92.
I., Dal, et al., "SFF-8431 Specifications for Enhanced 8.5 and 10 Gigabit Small Form Factor Pluggable Module "SFP+"", SFF Committee, SFF-8431, Revision 2.0, Apr. 26, 2007, pp. 1-104.
Leeson, Kim, et al., "A Cooperation Agreement for a Small Versatile 10 Gigabit Transceiver Package", X2MSA 10 Gigabit, Issue 2.0b, Apr. 7, 2005, pp. 1-30.

* cited by examiner

US 8,963,573 B2

UNIVERSAL TEST SYSTEM FOR TESTING ELECTRICAL AND OPTICAL HOSTS

TECHNICAL FIELD

This description relates to the testing of electro-optical equipment, and more specifically to a universal test system for testing both electrical and optical hosts.

BACKGROUND

Compact optical or electrical transceivers are often used in optical communications for both telecommunication and data communications applications. The transceivers are frequently packaged into modules, which are self-contained interchangeable units. These modules often couple a cable (e.g., fiber optic or unshielded twisted pair networking cable) with a network device (e.g., a mother board, line card, host, card, etc.). Frequently, a host card is designed to accept a plurality of modules (e.g., a 8-port line card would generally accept 8 modules). In addition, these modules may vary in terms of transmitter and receiver type. For example, some modules may process optical signals (e.g., 850 nm, 1310 nm, 1550 nm optical standards). Whereas, other modules may process electrical signals. Frequently, these modules will present the host card with a common interface, allowing the module types to be interchanged. Modules are typically provided or manufactured based on one or more industry standards or specifications that may be supported by several component vendors.

In the electro-optical standard known as Small Form-Factor Pluggable Plus (SFP+) the more complex conditioning and processing of signals is generally the responsibility of the host card. Whereas, the raw transmittal and receipt of the signals is the responsibility of the modules. An electrical high speed serial interface between the host card and the SFP+ is generally used. The host electrical high speed serial interface may typically include a transmitter pre-emphasis and a receiver equalizer to overcome circuit board and other external media impairments.

Currently, the testing of electro-optical equipment includes the use of specialized testing equipment. Typically, the testing equipment is a large motherboard or card based system that generates signals and waveforms and analyzes received signals and waveforms. Such large systems are often costly and do not scale well.

DESCRIPTION OF EXAMPLE EMBODIMENTS

Overview

Figure 1:
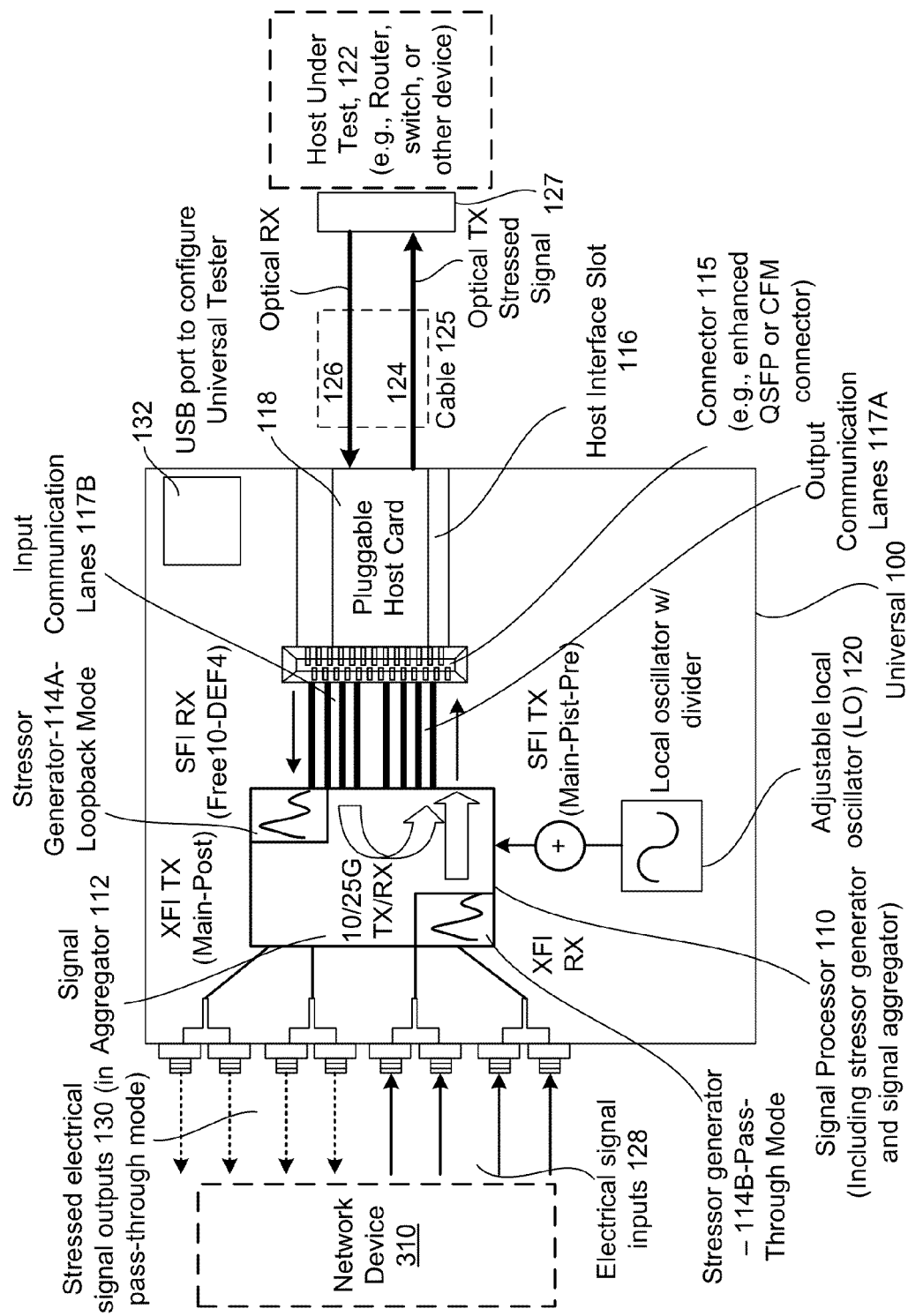
FIG. 1 is a block diagram of a universal tester 100 according to an example implementation.

A system and/or method for testing devices and interfaces used in the communicating of information, is substantially as shown in and/or described in connection with at least one of the figures, as set forth more completely in the claims.

According to an example implementation, a universal tester includes a host interface slot connected to a first pluggable host card during an electrical test mode of operation to provide a stressed electrical signal to a host under test. The host interface slot is connected to a second pluggable host card during an optical test mode of operation, the second pluggable host card including an electrical-optical conversion block to convert a stressed electrical signal to a stressed optical signal that is provided to a host under test. The universal tester also includes a stressor generator coupled to a first connector and to the host interface slot, the stressor generator configured to receive an electrical signal from the first connector and generate the stressed electrical signal that is output to the host interface slot during a pass-through mode for the stressor generator. The stressor generator is also configured to receive an electrical signal from the host interface slot and generate the stressed electrical signal that is output to the host interface slot during a loop-back mode for the stressor generator.

According to another example implementation, a universal tester includes a first host interface slot compatible with Quad Small Form-Factor Pluggable (QSFP/QSFP+) module standard and connected to a pluggable host card having at least a connector and form factor compatible with the QSFP/QSFP+ module standard to provide either a stressed electrical signal or a stressed optical signal to a host under test. The Universal tester includes a second host interface slot compatible with a C Form-Factor Pluggable (CFP) module standard and connected to a pluggable host card having at least a connector and form factor compatible with the CFP module standard to provide either a stressed electrical signal or a stressed optical signal to a host under test. The universal tester also includes a stressor generator coupled via a plurality of communication lanes to the first host interface slot and via a plurality of communication lanes to the second host interface slot.

According to another example implementation, a universal tester includes a first host interface slot compatible with a first pluggable module standard and connected to a first pluggable host card having at least a connector compatible with the first pluggable module standard to provide either a stressed electrical signal or a stressed optical signal to a host under test. The universal tester includes a second host interface slot compatible with a second pluggable module standard and connected to a second pluggable host card having at least a connector compatible with the second pluggable module standard to provide either a stressed electrical signal or a stressed optical signal to a host under test. The universal tester also includes a stressor generator coupled via a first set of communication lanes to the first host interface slot. The stressor generator is also coupled via a second set of communication lanes to the second host interface slot. At least some of the first set communication lanes are connected to at least some of the second set of communication lanes.

Example Embodiments

FIG. 1 is a block diagram of a universal tester 100 according to an example implementation. In the example implementation shown in FIG. 1, universal tester 100 is coupled to a host under test 122 via a cable 125 or other communications link which may include signals provided over lines 124 and 126. Communication lines 124, 126 may include, for example, optical fiber(s), twisted pair wires, a coaxial cable, or any other physical communications link. Host under test 122 may include any host computing device, such as a router, a switch, or other network device, for example.

Universal tester 100 may test hosts in either an electrical mode (using electrical signals) or an optical mode (using optical signals), for different or multiple frequencies of signals. Also, the universal tester 100 may operate in either a pass-through mode or a loop-back mode to allow for different testing configurations. In this manner, the tester 100 may be considered universal, since it may allow testing of hosts in either optical or electrical modes, for multiple signal frequencies, and in loop-back or pass-through modes of operation.

Universal tester 100 may include a host interface slot 116 that may receive one of a plurality of pluggable host cards, such as pluggable host card 118. One of a plurality of different types of pluggable host cards may be plugged into connector 115 of host interface slot 116. Host interface slot 116 may be compatible with (e.g., having a connector, a form factor, and/or other physical or electrical properties or characteristics that are compliant with) a pluggable module standard, such as Quad Small Form-Factor Pluggable (QSFP/QSFP+) module standard, C Form-Factor Pluggable (CFP) module standard, or other pluggable module standard.

Pluggable host card 118 may provide an interface between the pluggable module standard used by host interface slot 116 to an interface standard that may be used by host under test 122. For example, pluggable host card 118 may have a connector on one side for plugging into host interface slot 116, and a connector on a second side for plugging in (or connecting to) host under test 122. In another example implementation, pluggable host card 118 may be connected to a cable 125 to carry signals via lines 124 and 126, and a host connector 127 may be attached to the cable 125, where the host connector 127 may be compatible with an interface or communications standard that may be used by host under test 122. The host connector 127 may be connected to cable 125 and to host under test 122.

Different types of pluggable host cards 118 may be plugged into host interface slot 116, depending on whether the universal tester 100 is operating in electrical test mode (to test host 122 using electrical signals) or optical test mode (to test host 122 using optical signals). In an electrical test mode of operation, universal tester 100 may send and/or receive electrical signals via lines 124 and 126 of cable 125 to and/or from host under test 122. In an optical test mode of operation, universal tester 100 may send and/or receive optical signals to and/or from host under test 122, which is shown in FIG. 1. Electrical signals (in electrical test mode) or optical signals (in optical test mode) may be sent or transmitted from pluggable host card 118 to host under test 122 via line 124 of cable 125, and electrical or optical signals may be received by pluggable host card 118 from host under test 122 via line 126 of cable 125.

Universal tester 100 may include a signal processor 110 for processing signals. Signal processor 110 may be connected to connector 115 of host interface slot 116 via one or more communication lanes 117, such as a plurality of input communication lanes 117B for signal processor 110 to receive electrical signals from host interface slot 116 and pluggable host card 118, and output communication lanes 117A for signal processor 110 to output electrical signals to host interface slot 116 and pluggable host card 118. Each communication lane 117 may include, for example, a separate electrical conductor, trace or electrical link to allow an electrical signal to be communicated.

In one example implementation, four output communication lanes 117A and four input communication lanes 117B may be provided, with each communication lane carrying, for example, one 10 Gb/s signal, one 25 Gb/s signal, or a signal at another frequency. Thus, the four input communication lanes 117 in each direction may collectively provide a 4×25 Gb/s signals for a total of a 100 Gb/s input or output signal, or 4×10 Gb/s signal for a total of a 40 Gb/s input or output signal. These are merely some examples and other signal frequencies and other numbers of communication lanes may be used.

Therefore, more generally, 2Y connector lanes 117 may be provided, including at least Y output connector lanes 117A, and at least Y input connector lanes 117B. Y may be any number, such as 10 or 4, for example.

Signal processor 110 may include, for example, a stressor generator 114 for generating stressed signals, and a signal aggregator 112 for aggregating received signals for output. Stressor generator 114 may generate a stressed electrical signal based on a received (e.g., unstressed) electrical signal. Through use of stressor generator 114, a stressed signal may be generated that may be similar to a signal that has been modified, distorted, etc., during communication, so as to allow a receiving host device to be tested. Thus, the testing of the host device using the stressed signal may confirm that the host is able to receive and detect data signals that have been modified or distorted based on a limited bandwidth channel, signal interference or other condition that may affect a signal during signal transmission, for example. In one example implementation, stressor generator 114 may modify or stress the received electrical signal, such as, for example, by applying or adding: Gaussian noise or sinusoidal jitter to the received signal, applying a low pass filter to the signal to simulate a limited bandwidth channel, adjusting the vertical eye closure of the signal, or other signal processing or signal modification. Therefore, the universality of universal tester 100 is improved by providing a variety or plurality of different stressors that may be applied to a signal.

Signal processor 110 may also include, for example, an adjustable local oscillator (LO) 120 (LO with divider) for generating signals for output at a plurality of different (or variable) frequencies, e.g., 10 Gb/s, 25 Gb/s, or other frequency, to provide a multi-frequency universal tester 100. At least a portion of signal processor 110, including stressor generator 114, may be implemented using a multi-tap digital filter, for example.

Signal processor 110, including the stressor generator 114, may operate in a pass-through mode or in a loop-back mode. Thus, for example, stressor generator 114 may include stressor generator 114A for pass-through mode, and a stressor generator 114B for loop-back mode. Stressor generators 114A and 114B may be either separate stressor generators, or may be a single stressor generator that may operate in one of two different modes, e.g., loop-back mode and pass-through mode.

In one example implementation of a loop-back mode of operation for signal processor 110 and/or stressor generator 114, electrical signals may be generated by host 122 and transmitted via cable 125 to pluggable host card 118. Pluggable host card 118 transmits or forwards the received electrical signals via input communication lanes 117B to signal processor 110 and stressor generator 114. Pluggable host card 118 may perform O-E (optical-to-electrical) signal conversion if the signal from host 122 is an optical signal, prior to transmitting the electrical signal to signal processor 110. Stressor generator 114A may generate a stressed electrical signal based on the received signal, and output (or loop-back) the stressed electrical signal to pluggable host card 118 via output communication lanes 117A. Pluggable host card 118 may convert the stressed electrical signal to a stressed optical signal if optical test mode is needed for testing the host under test 122. Pluggable host card 118 may forward or transmit the stressed electrical or stressed optical signal to host under test 122. Host 122 may then detect and report errors in the received signal.

In one example implementation of a pass-through mode of operation for signal processor 110 and/or stressor generator 114, electrical signals may be generated or output from a signal generation device or network device (not shown in FIG. 1, but similar to network device 310 of FIG. 3) that is connected to signal inputs 128. These electrical signals may be input to universal tester 100 via electrical signal inputs 128. Signals (e.g., stressed electrical signals) may also be output from universal tester or stressor generator 114 via signal outputs 130. The electrical signals input to universal tester 100 via inputs 128 and/or signals output or transmitted from universal tester 100 via outputs 130 may, for example, be provided in XFI electrical signal format, or may include electrical signals that are compliant with other signal format, specification or standard. In an example implementation, stressor generator 114B provided for pass-through mode may receive the electrical signals input via electrical signal inputs 128 and generates a stressed electrical signal that is output to the host interface slot 116 (and to the connected pluggable host card 118) via one or more output communication lanes 117A. In one example embodiment, the stressed electrical signal(s) are received by pluggable host card 118 via communication lanes 117A. The stressed electrical signal(s) are then output via a cable 125 (which may include communication paths or lines 124, 126) to host under test 122. Host under test may detect and report any errors and/or a bit error rate, etc.

In one example implementation, electrical signals transmitted or output by signal processor 110 to pluggable host card 118 via output communication lanes 117A and received by signal processor 110 via input communication lanes 117B may be provided in an SFI electrical signal format or standard.

Also, signal processor 110 may include a dispersion compensation and/or equalization circuit in which, for example, pre-emphasis, post-emphasis, and Main tap compensation may be provided on signals output via communication lanes 117A. Similarly, the dispersion compensation and/or equalization block of signal processor 110 may also provide main tap and post-emphasis signal modification of the electrical signals transmitted by signal processor 110 (or by stressor generator 114), according to an example implementation.

In a first example implementation, a first pluggable host card 118 may be plugged into host interface slot 116, where the first pluggable host card does not (necessarily) include an optical-to-electrical (O-E) or electrical-to-optical (E-O) signal conversion. Therefore, in such case, the first pluggable host card 118 simply passes the stressed electrical signal as a stressed electrical signal to host 122 for testing in electrical mode.

In a second example implementation, a second pluggable host card 118 (instead of the first pluggable host card) may be plugged into host interface slot 116 where the second pluggable host card 118 includes O-E and/or E-O signal conversion. Therefore, in this example, the second pluggable host card may receive a stressed electrical signal from stressor generator 114A or 114B via communication lanes 117A, converts the stressed electrical signal into a corresponding stressed optical signal via E-O signal conversion, and outputs the stressed optical signal to host under test 122, e.g., via cable 125 (which may be an optical cable in this case) and connector 127. Likewise, for this second example implementation, an optical signal may be received by pluggable host card 118 from host under test 122, converted to a corresponding electrical signal using O-E conversion, and output via communication lanes 117B to signal processor 110.

In an example implementation, regardless of whether the stressed signal is provided to host 122 as an electrical or optical signal, the host under test 122 may, for example, perform error detection on the received signals, and may determine an overall error rate. The error rate may then be reported to a user, a program or application, or to a network administrator, for example.

Universal tester 100 may also include a serial port, such as a Universal Serial Bus (USB) port 132 to allow various adjustable or programmable aspects of universal tester to be set, adjusted or programmed, such as, for example, taps of a filter that may be included as part of signal processor 110.

Figure 2:
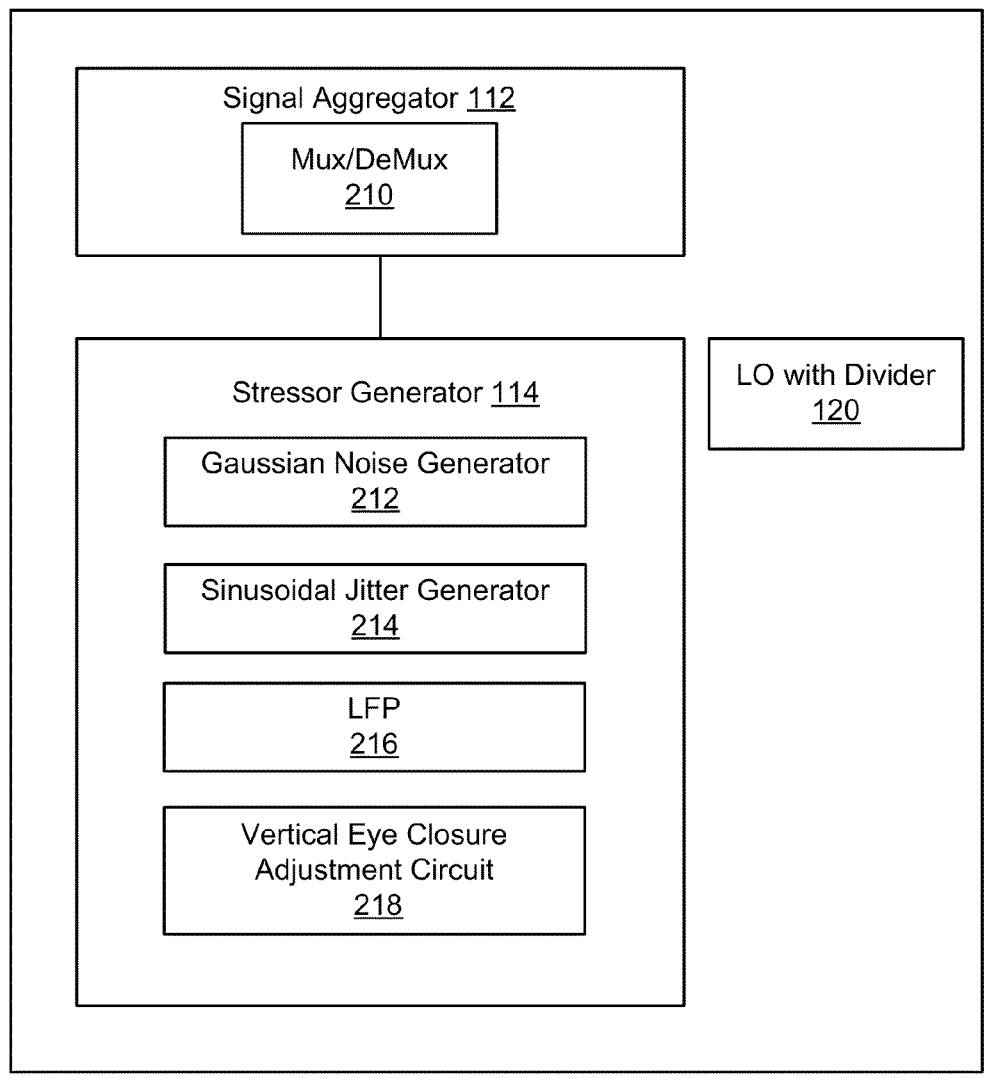
FIG. 2 is a block diagram of a signal processor 110 according to an example embodiment.

FIG. 2 is a block diagram of a signal processor 110 according to an example embodiment. Signal processor 110 may include a signal aggregator 112 for aggregating signals and a stressor generator 114 for generating stressed electrical signals. Signal processor 110 may also include a local oscillator (LO) with a divider to allow signal processor to generate signals of varying or different frequencies, for example.

Signal 110 (FIG. 2) aggregator may include a multiplexer and a demultiplexer (mux/demux) circuit 210 that may multiplex and/or demultiplex signals. Multiplexing may include, for example, sending multiple signals or streams of information on a carrier at the same time in the form of a single, complex signal. The original signal may be recovered at the receiving end by demultiplexing the separate signals at the receiving end. A signal may initially be multiplexed as M X Gb/s signals, where M is the number of multiplexed signals, and X is the frequency or rate of each multiplexed signal. For example, a signal may be multiplexed onto four 10 Gb/s signals. Mux/demux 210 of signal aggregator 110 may derive or obtain the original signal by demultiplexing the M signals that are received at a first frequency (X Gb/s), and then may re-multiplex this signal as N multiplexed signals, which may be provided at a second data rate, e.g., N signals, each at a rate (e.g., data rate or a signal rate) of Y Gb/s. In this manner, signal processor 110 of universal tester may interface or provide communication between signals having a different number of multiplexed signals and different data rates.

For example, referring to FIG. 1, an original 100 Gb/s signal may be multiplexed into four approximately 25 Gb/s signals. The four approximately 25 Gb/s signals may be input to universal tester 100 via the four electrical signal inputs 128, with one 25 Gb/s on each input 128. A first two of the 25 Gb/s signals are input via one input to signal processor 110, and a second two of the 25 Gb/s signals are input via a second input to signal processor 110. Signal aggregator 210 of signal processor 110 receives and demultiplexes (or combines) the four separate 25 Gb/s signals, and then may re-multiplex this resulting signal into 10 approximately 10 Gb/s signals. Thus, the original signal was approximately 100 Gb/s signal (received as 4× approximately 25 Gb/s signals), and it is still approximately 100 Gb/s after demultiplexing and remultiplexing the signals to 10×10 Gb/s. Each of these approximately 10 Gb/s signals may be output by aggregator 210 of signal processor 110 to pluggable host card via 10 output communication lanes 117A (FIG. 1), with one of the 10 Gb/s signals on each communication lane 117A.

Similarly, a 50 Gb/s signal that includes two approximately 25 Gb/s signals may be received on inputs 128. Signal aggregator 112 may demultiplex or combine the two approximately 25 Gb/s signals to obtain one 50 Gb/s signal, and then may re-multiplex this signal as four×approximately 10 Gb/s signals. Signal processor 110 (FIG. 1) may then output these four signals onto output communication lanes 117A, one approximately 10 Gb/s signal per communication lane. These are merely some examples, and the invention is not limited thereto. Other signal data rates and other numbers of multiplexed signals may be used.

In this manner, signal aggregator 112 may aggregate or demultiplex M signals, each at X Gb/s, and then multiplex the combined or resulting signal into N approximately Y Gb/s signals, with each of the Y multiplexed signals being provided on the different output or a different communication lane, for example.

As shown in FIG. 2, stressor generator 114 may include several circuits or blocks that may be used to apply a stress to a signal, or to generate a stressed signal. A stressed signal, as generated by stressor generator 114, may simulate the various distortions, impairments, noise and other changes that may occur to a signal during transmission. The purpose of a stressor generator may be to allow a host 122 to be tested for a signal with poor or worst case distortions or impairments, while still providing a signal that meets some minimum criteria. The stressor generator 114 may also the margins of circuits on the host 122 to be checked and verified.

The various example stressor circuits of stressor generator 114 may include a Gaussian noise generator 212 to inject Gaussian noise into a received electrical signal, a sinusoidal jitter generator 214 to inject sinusoidal jitter into the received electrical signal, a low pass filter (LPF) 216 to simulate the introduction of inter-symbol interference or a limited bandwidth channel for the received electrical signal, and a vertical eye closure adjustment circuit 218 to adjust the vertical eye closure of the received electrical signal. While only four example stressor circuits are shown in FIG. 2, these are merely example stressor circuits, and others may be used.

According to one example implementation, the vertical eye may be the vertical distance (or voltage difference) between a received "0" and a received "1." For example, a 1 may be provided at around 2.5 volts, and a 0 may be provided at around 0.5 volts. The vertical eye in this example may be approximately 2.0 volts. The larger the vertical eye, the easier it is for a receiver to distinguish between a 0 and a 1, and hence, this would typically provide a lower data error rate at the receiver. However, a signal may be degraded during transmission, which may cause the vertical eye to close or decrease. The reduction in vertical eye may be referred to as vertical eye closure. A smaller (or at least partially closed) vertical eye may make it more challenging for a receiver to correctly detect data, and may therefore cause data error rate to increase.

In one example embodiment, vertical eye closure adjustment circuit 218 may be implemented as an amplitude modulation (AM) circuit that may decrease the voltage of a 1 signal, and may increase the voltage of a 0 signal, assuming that a 1 signal has a higher voltage than a 0 signal in this example (it may be the other way around, depending on the notation). This will cause a vertical eye closure or a decrease in vertical distance or voltage between a 1 and a 0.

Figure 3:
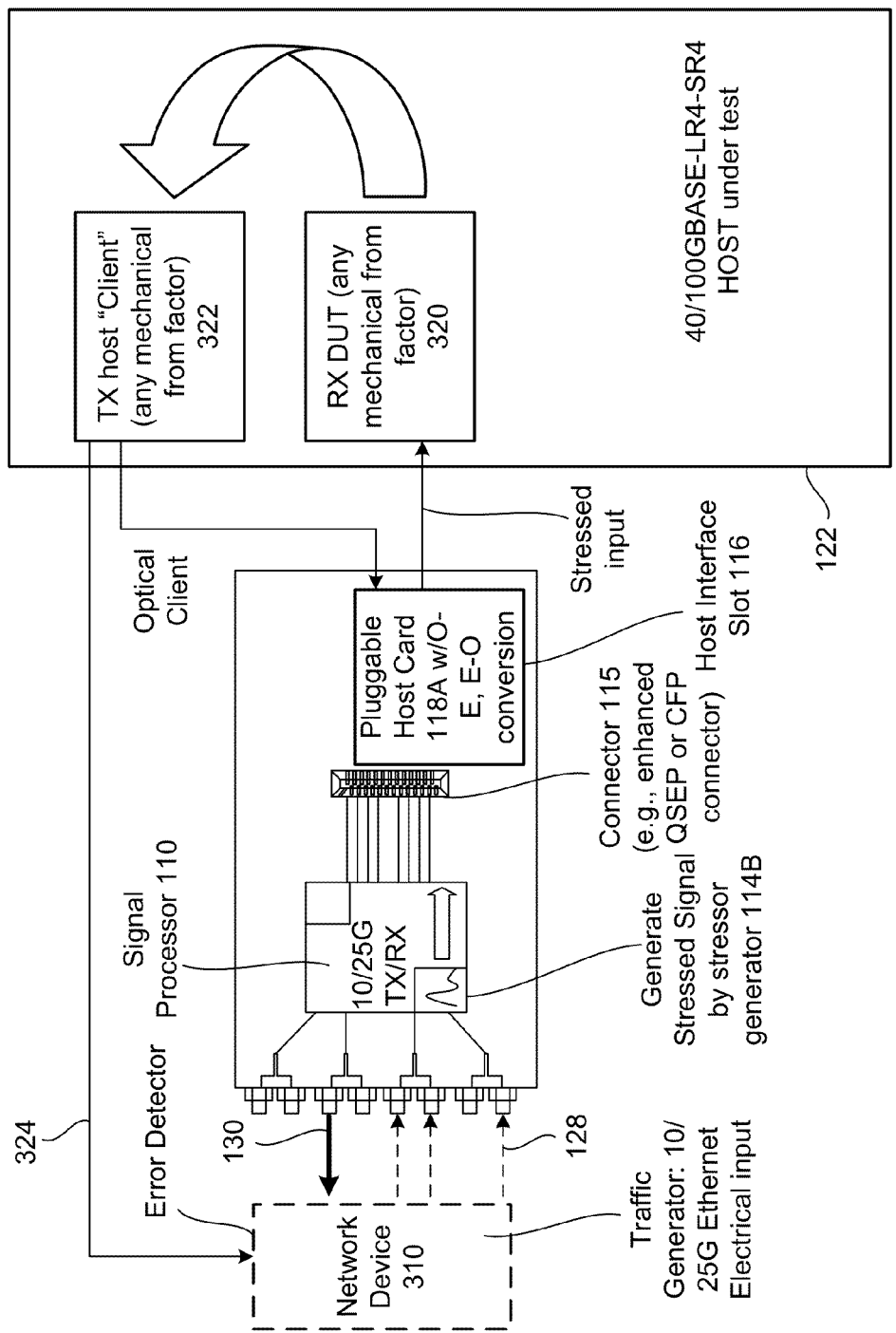
FIG. 3 is a block diagram of a universal tester 300 according to another example implementation.

FIG. 3 is a block diagram of a universal tester 300 according to another example implementation. Universal tester 300 may be similar to, or even the same as, Universal tester 100, with some differences described below. The configuration shown in FIG. 3 is different from that shown in FIG. 1, since host under test 122 in FIG. 3 may operate in a loop-back mode to loop back received data.

Universal tester 300 may include a signal processor 110 with a stressor generator 114B for pass-through mode. A network device 310 may generate traffic or a data signal(s) that may be input to universal tester 300 via one or more signal inputs 128. Stressor generator 114B, operating in pass-through mode, may generate a stressed electrical signal based on the received signal, and may output or pass-through the stressed electrical signal via output communication lane(s) 117A to a pluggable host card 118A. Pluggable host cad 118A may include an O-E and E-O conversion block to convert signals between electrical and optical. Pluggable host card 118A may convert the received stressed electrical signal to a corresponding stressed optical signal, and output the stressed optical signal to host under test 122. Host 122 may include a receive host device 320 (or receive device under test), which may include a network interface or other device, for receiving the stressed electrical signals. Host 122 may also include a transmit host device 322 for transmitting the received signals back to universal tester 100. The receive host device 320 and transmit host device 322 may be connected in a loop-back configuration or mode where data received by receive host device 320 is looped-back to universal tester 300 via transmit host device 322. In one example implementation, host 122 does not perform error detection or error correction, but relies on network device 310 to perform error detection and correction, when the looped back data is received by network device 310. Devices 320 and 322 may be network interfaces or network devices, and may be provided on the same host device 122, or on different host devices.

Thus, the received optical signals received by host receive device 320 are converted linearly to a corresponding electrical signal(s) and then looped back to transmit host device 322 where this electrical signal is converted linearly to corresponding optical signal before being transmitted back to pluggable host card 118A via communication lanes 117B. Pluggable host card may convert linearly the received optical signals from transmit host device 322 to a corresponding electrical signal, which is then transmitted or forwarded to the signal processor 110. Signal processor 110 then forwards the received electrical signal back to network device 310 where the originally transmitted electrical signal is compared to the received (or returned) electrical signal, and any errors or discrepancies may be identified and/or a bit error rate may be calculated by network device 310, for example.

In an example implementation that is slightly different from that shown in FIG. 3, network device 310 may generate a signal which is input to universal tester 300 via input lines 128. Signal processor 110 and stressor generator 114B operate in pass-through mode, and stressor generator 114B outputs (or generates) a stressed electrical signal to pluggable host card 118 or 118A. E-O conversion may be performed if pluggable host card is plugged in that includes E-O and O-E conversion, and optical test mode is to be used. Otherwise, no E-O conversion is performed. The stressed signal is output by pluggable host card 118 or 118A to host under test 122. Host under test 122 may perform error detection and/or correction, e.g., using a CRC (cyclic redundancy check) or other technique. However, rather than inputting or looping the received signal back to pluggable host card 118/118A (via loop-back) as shown in FIG. 3, an additional cable 324 may be provided to directly connect an output of transmit host device 322 of host 122 to network device 310. This may allow the received signal (e.g., after error detection and/or correction at host 122) to be input directly to network device 310. Network device 310 may then compare the originally transmitted signal (from network device 310) to the signal received at network device 310 via cable 324 to determine or measure an error rate for host under test 122, for example.

The universal tester of claim 12 wherein the stressor generator is configured to receive an electrical signal from a first connector and to generate the stressed electrical signal that is output to at least one of the host interface slots during a pass-through mode for the stressor generator, the stressor generator also configured to receive an electrical signal from one of the host interface slots and to generate the stressed electrical signal that is output to at least one of the host interface slots during a loop-back mode for the stressor generator.

Figure 4:
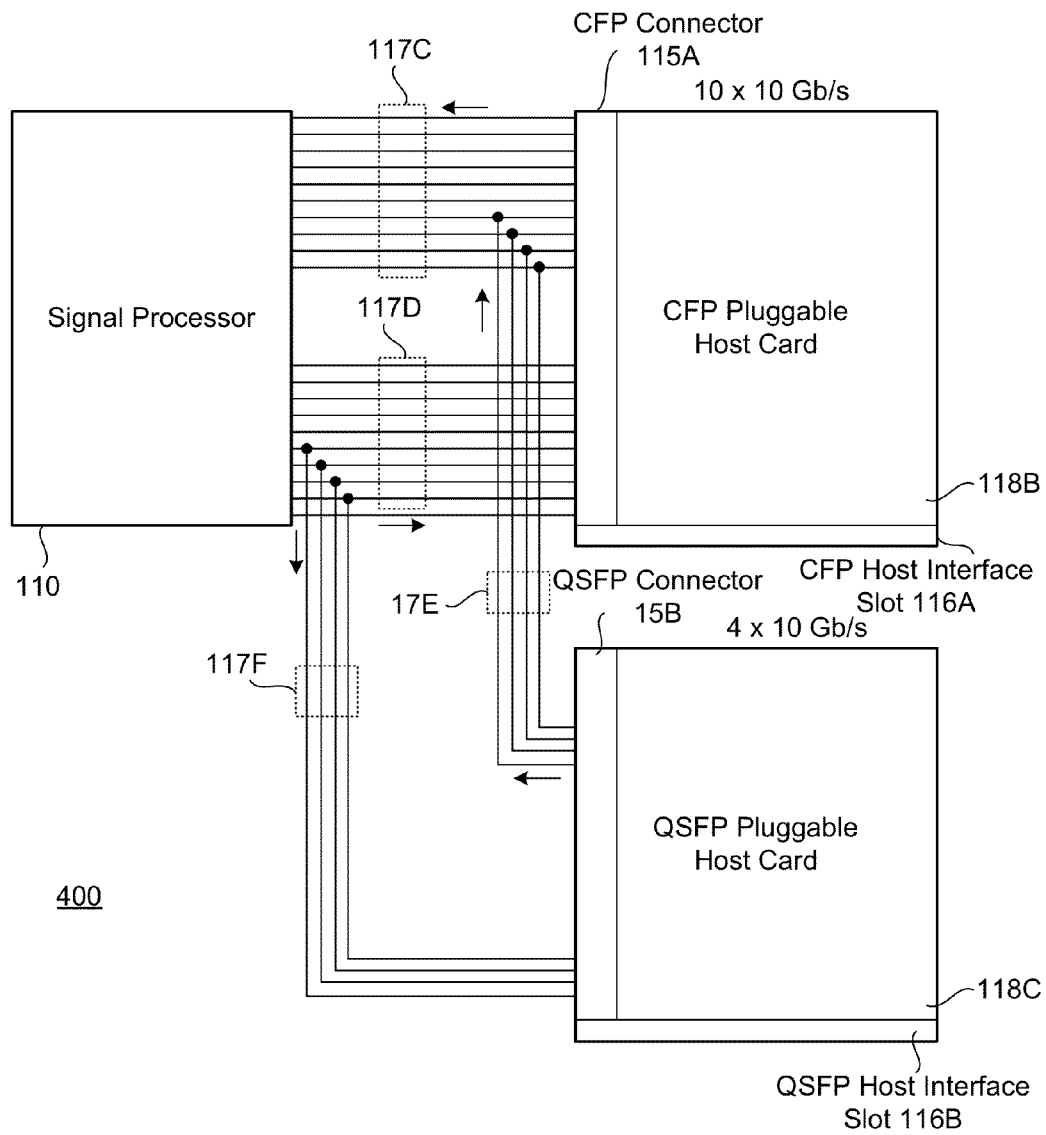
FIG. 4 is a diagram illustrating a universal tester 400 (or a portion thereof) according to another example implementation.

FIG. 4 is a diagram illustrating a universal tester 400 (or a portion thereof) wherein two host interface slots compatible with different pluggable module standards are connected to a signal processor via communication lanes according to an example implementation. A signal processor 110 is connected via ten input communication lanes 117C and ten output communication lanes 117D to a first host interface slot 116A that is compatible with a first pluggable module standard (e.g., CFP). Similarly, signal processor 110 is connected via four input communication lanes 117E and four output communication lanes 117F to a second host interface slot 116B that is compatible with a second pluggable module standard (e.g., QSFP/QSFP+).

A CFP pluggable host card 118B, that is compatible with CFP pluggable standard, may be plugged into CFP host interface slot 116A. CFP pluggable host card 118B may be a first CFP pluggable host card that does not necessarily include an O-E and E-O conversion, to provide for an electrical test mode for a host under test. Alternatively, a second CFP pluggable host card 118B may be plugged into CFP host interface slot 116A, and may include O-E and E-O signal conversion to provide for optical test mode for a host under test. Similarly, a QSFP pluggable host card 118C, that is compatible with QSFP pluggable standard, may be plugged into QSFP host interface slot 116B. QSFP pluggable host card 118C may be either a first QSFP pluggable host card that does not include E-O and O-E signal conversion for electrical test mode or a second QSFP pluggable host card 118C that includes a O-E and E-O signal conversion for testing a host under test in an optical test mode.

Referring to FIG. 4, signal processor 110 is connected to CFP host interface slot 116A and CFP pluggable host card 118B via ten input communication lanes 117C and ten output communication lanes 117D. This allows, for example, for a 10×10 Gb/s signal in each direction (input and output). Signal processor 110 is also connected to QSFP host interface slot 116B and QSFP pluggable host card 118C via four input communication lanes 117E and four output communication lanes. This allows, for example, for a 4×10 Gb/s signal in each direction for the QSFP pluggable host card 118C. Thus, providing host two interface slots 116A and 116B, each interface slot compatible with a different pluggable module standard (e.g., QSFP as a first standard, and CFP as a second standard), increases the flexibility of universal tester 100.

As shown in FIG. 4, the four input communication lanes 117E are connected to four of the ten input communication lanes 117C (e.g., lanes 117E and four of the lanes 117C share common inputs to signal processor 110), and the four output communication lanes 117F are connected to four of the ten output communication lanes 117D (e.g., lanes 117F and four of the lanes 117D share common inputs to signal processor 110). In an example implementation, this arrangement may save space used for lanes and/or may reduce the number of communication lanes connected to signal processor 110 (only 20 lanes are connected to signal processor 110, instead of 28 lanes).

According to an example embodiment, a universal tester (e.g., 100) may include a host interface slot connected to a first pluggable host card during an electrical test mode of operation to provide a stressed electrical signal to a host under test (e.g., 122). The host interface slot is connected to a second pluggable host card during an optical test mode of operation, the second pluggable host card including an electrical-optical conversion block to convert a stressed electrical signal to a stressed optical signal that is provided to a host under test. The universal tester also includes a stressor generator (e.g., 114A, 114B) coupled to a first connector (e.g., 128, 130) and to the host interface slot (116). The stressor generator is configured to receive an electrical signal from the first connector and generate the stressed electrical signal that is output to the host interface slot during a pass-through mode for the stressor generator. The stressor generator is also configured to receive an electrical signal from the host interface slot and generate the stressed electrical signal that is output to the host interface slot during a loop-back mode for the stressor generator.

In an example implementation, the universal tester is configurable to: test a host under test in either an electrical test mode of operation or an optical test mode of operation, and operate in either the pass-through mode or the loop-back mode for the stressor generator.

In an example implementation, the second pluggable host card includes an electrical-optical conversion block to perform electrical to optical signal conversion and optical to electrical signal conversion.

The stressor generator may include: a Gaussian noise generator to inject Gaussian noise into a received electrical signal; a sinusoidal jitter generator to inject sinusoidal jitter into the received electrical signal; a low pass filter to simulate the introduction of inter-symbol interference or a limited bandwidth channel for the received electrical signal; and a vertical eye closure adjustment circuit to adjust the vertical eye closure of the received electrical signal.

The universal tester may also include a signal processor that includes the stressor generator, the signal processor coupled to the first connector, the signal processor also connected to the host interface slot via at least 2Y electrical communication lanes with at least Y electrical communication lanes for transmission of signals from the signal processor to the host interface slot and with at least Y electrical communication lanes for transmission of signals from the host interface slot to the signal processor.

In another example implementation, the universal tester may include a signal processor that includes the stressor generator and a signal aggregator, the signal processor coupled to the first connector, the signal processor connected to the host interface slot via at least 2Y electrical communication lanes with at least Y electrical communication lanes for transmission of signals from the signal processor to the host interface slot and with at least Y electrical communication lanes for transmission of signals from the host interface slot to the signal processor. Also, the signal aggregator is configured to receive X approximately 25 Gb/s signals via the first connector and convert the X approximately 25 Gb/s signals to Y approximately 10 Gb/s signals to be provided to the host interface slot via the Y electrical communication lanes, with each of the Y approximately 10 Gb/s signals to be provided via one of the Y electrical communication lanes.

In another example implementation, the universal tester may include a signal processor that includes the stressor generator and a signal aggregator, the signal processor coupled to the first connector and the host interface slot via a plurality of electrical communication lanes, wherein the signal aggregator is configured to receive two approximately 25 Gb/s signals via the first connector and convert the two approximately 25 Gb/s signals to four approximately 10 Gb/s signals to be provided to the host interface slot via the at least some of the electrical communication lanes, with each of the four approximately 10 Gb/s signals to be provided via one of the electrical communication lanes.

In another example implementation, the universal tester may include a signal processor that includes the stressor generator and a signal aggregator, the signal processor coupled to the first connector and the host interface slot via a plurality of electrical communication lanes, wherein the signal aggregator is configured to receive four approximately 25 Gb/s signals via the first connector and convert the four approximately 25 Gb/s signals to ten approximately 10 Gb/s signals to be provided to the host interface slot via the at least some of the electrical communication lanes, with each of the ten approximately 10 Gb/s signals to be provided via one of the electrical communication lanes.

In another example implementation, the universal tester includes a signal processor that includes the stressor generator and a signal aggregator, the signal processor coupled to the first connector and the host interface slot via a plurality of electrical communication lanes, wherein the signal aggregator is configured to convert X approximately 25 Gb/s signals received via the first connector to Y approximately 10 Gb/s signals to be provided to the host interface slot via the at least some of the electrical communication lanes, and to convert Y approximately 10 Gb/s signals received from the host interface slot to X approximately 25 Gb/s signals to be provided to the first connector.

In another example implementation, the host interface slot is compatible with a first pluggable module standard, wherein the universal tester further includes: a second host interface slot connected to the stressor generator, the second host interface slot compatible with a second pluggable module standard. The second host interface slot is connected to a third pluggable host card that is compatible with the second pluggable module standard during an electrical test mode of operation to provide a stressed electrical signal to a host under test. The second host interface slot is connected to a fourth pluggable host card that is compatible with the second pluggable module standard during an optical test mode of operation, the fourth pluggable host card including an electrical-to-optical signal conversion block to convert a stressed electrical signal to a stressed optical signal that is provided to a host under test.

In another example implementation, the first pluggable module standard may include Quad Small Form-Factor Pluggable (QSFP/QSFP+) module standard, and the second pluggable module standard comprises C Form-Factor Pluggable (CFP) module standard.

According to another example implementation, a universal tester may include a first host interface slot compatible with Quad Small Form-Factor Pluggable (QSFP/QSFP+) module standard and connected to a pluggable host card having at least a connector and form factor compatible with the QSFP/QSFP+ module standard to provide either a stressed electrical signal or a stressed optical signal to a host under test. The universal tester may also include a second host interface slot compatible with a C Form-Factor Pluggable (CFP) module standard and connected to a pluggable host card having at least a connector and form factor compatible with the CFP module standard to provide either a stressed electrical signal or a stressed optical signal to a host under test. The universal tester may also include a stressor generator coupled via a plurality of communication lanes to the first host interface slot and via a plurality of communication lanes to the second host interface slot. In one example implementation, least some of the communication lanes connected from the stressor generator to the first host interface slot are connected to at least some of the communication lanes connected from the stressor generator to the second host interface slot.

In another example implementation, the stressor generator is configured to receive an electrical signal from a first connector and to generate the stressed electrical signal that is output to at least one of the host interface slots during a pass-through mode for the stressor generator, the stressor generator also configured to receive an electrical signal from one of the host interface slots and to generate the stressed electrical signal that is output to at least one of the host interface slots during a loop-back mode for the stressor generator.

According to yet another example implementation, a universal tester may include a first host interface slot compatible with a first pluggable module standard and connected to a first pluggable host card having at least a connector compatible with the first pluggable module standard to provide either a stressed electrical signal or a stressed optical signal to a host under test. The universal tester may also include a second host interface slot compatible with a second pluggable module standard and connected to a second pluggable host card having at least a connector compatible with the second pluggable module standard to provide either a stressed electrical signal or a stressed optical signal to a host under test. The universal tester may also include a stressor generator coupled via a first set of communication lanes to the first host interface slot, and the stressor generator also being coupled via a second set of communication lanes to the second host interface slot. At least some of the first set communication lanes are connected to at least some of the second set of communication lanes.

In an example implementation, the stressor generator is configured to receive an electrical signal from a first connector and to generate the stressed electrical signal that is output to at least one of the host interface slots during a pass-through mode for the stressor generator, the stressor generator also configured to receive an electrical signal from one of the host interface slots and to generate the stressed electrical signal that is output to at least one of the host interface slots during a loop-back mode for the stressor generator.

Implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A universal tester comprising:
   a host interface slot connected to a first pluggable host card during an electrical test mode of operation to provide a stressed electrical signal to a host under test;
   the host interface slot connected to a second pluggable host card during an optical test mode of operation, the second pluggable host card including an electrical-optical conversion block to convert a stressed electrical signal to a stressed optical signal that is provided to the host under test; and
   a stressor generator coupled to a first connector and to the host interface slot, the stressor generator receives an electrical signal from the first connector and generates the stressed electrical signal that is output to the host interface slot during a pass-through mode for the stressor generator, the stressor generator also receives an electrical signal from the host interface slot and generates the stressed electrical signal that is output to the host interface slot during a loop-back mode for the stressor generator.

2. The universal tester of claim 1, wherein the universal tester:
   tests the host under test in either an electrical test mode of operation or an optical test mode of operation; and
   operates in either the pass-through mode or the loop-back mode for the stressor generator.

3. The universal tester of claim 1, wherein the second pluggable host card includes the electrical-optical conversion block to perform electrical to optical signal conversion and optical to electrical signal conversion.

4. The universal tester of claim 1, wherein the stressor generator comprises:
   a Gaussian noise generator to inject Gaussian noise into a received electrical signal;
   a sinusoidal jitter generator to inject sinusoidal jitter into the received electrical signal;
   a low pass filter to simulate the introduction of inter-symbol interference or a limited bandwidth channel for the received electrical signal; and
   a vertical eye closure adjustment circuit to adjust the vertical eye closure of the received electrical signal.

5. The universal tester of claim 1, wherein the universal tester comprises a signal processor that includes the stressor generator, the signal processor coupled to the first connector, the signal processor also connected to the host interface slot via at least 2Y electrical communication lanes with at least Y electrical communication lanes for transmission of signals from the signal processor to the host interface slot and with at least Y electrical communication lanes for transmission of signals from the host interface slot to the signal processor.

6. The universal tester of claim 1, wherein the universal tester comprises a signal processor that includes the stressor generator and a signal aggregator, the signal processor coupled to the first connector, the signal processor connected to the host interface slot via at least 2Y electrical communication lanes with at least Y electrical communication lanes for transmission of signals from the signal processor to the host interface slot and with at least Y electrical communication lanes for transmission of signals from the host interface slot to the signal processor, wherein the signal aggregator receives X approximately 25 Gb/s signals via the first connector and converts the X approximately 25 Gb/s signals to Y approximately 10 Gb/s signals to be provided to the host interface slot via the Y electrical communication lanes, with each of the Y approximately 10 Gb/s signals to be provided via one of the Y electrical communication lanes.

7. The universal tester of claim 1, wherein the universal tester comprises a signal processor that includes the stressor generator and a signal aggregator, the signal processor coupled to the first connector and the host interface slot via a plurality of electrical communication lanes, wherein the signal aggregator receives two approximately 25 Gb/s signals via the first connector and converts the two approximately 25 Gb/s signals to four approximately 10 Gb/s signals to be provided to the host interface slot via the at least some of the electrical communication lanes, with each of the four approximately 10 Gb/s signals to be provided via one of the electrical communication lanes.

8. The universal tester of claim 1, wherein the universal tester comprises a signal processor that includes the stressor generator and a signal aggregator, the signal processor coupled to the first connector and the host interface slot via a plurality of electrical communication lanes, wherein the signal aggregator receives four approximately 25 Gb/s signals via the first connector and converts the four approximately 25 Gb/s signals to ten approximately 10 Gb/s signals to be provided to the host interface slot via the at least some of the electrical communication lanes, with each of the ten approximately 10 Gb/s signals to be provided via one of the electrical communication lanes.

9. The universal tester of claim 1, wherein the universal tester comprises a signal processor that includes the stressor generator and a signal aggregator, the signal processor coupled to the first connector and the host interface slot via a plurality of electrical communication lanes, wherein the signal aggregator converts X approximately 25 Gb/s signals received via the first connector to Y approximately 10 Gb/s signals to be provided to the host interface slot via the at least some of the electrical communication lanes, and converts Y approximately 10 Gb/s signals received from the host interface slot to X approximately 25 Gb/s signals to be provided to the first connector.

10. The universal tester of claim 1, wherein the host interface slot is compatible with a first pluggable module standard, wherein the universal tester further comprising:
a second host interface slot connected to the stressor generator, the second host interface slot compatible with a second pluggable module standard;
wherein the second host interface slot is connected to a third pluggable host card that is compatible with the second pluggable module standard during an electrical test mode of operation to provide a stressed electrical signal to the host under test; and
wherein the second host interface slot is connected to a fourth pluggable host card that is compatible with the second pluggable module standard during an optical test mode of the fourth pluggable host card including an electrical-to-optical signal conversion block to convert a stressed electrical signal to a stressed optical signal that is provided to the host under test.

11. A universal tester comprising:
a first host interface slot compatible with a first pluggable module standard and connected to a first pluggable host card having at least a connector compatible with the first pluggable module standard to provide either a stressed electrical signal or a stressed optical signal to a host under test;
a second host interface slot compatible with a second pluggable module standard and connected to a second pluggable host card having at least a connector compatible with the second pluggable module standard to provide either a stressed electrical signal or a stressed optical signal to a host under test; and
a stressor generator coupled via a plurality of communication lanes to the first host interface slot and via a plurality of communication lanes to the second host interface slot, wherein the stressor generator receives an electrical signal from a first connector and generates the stressed electrical signal that is output to at least one of the host interface slots during a pass-through mode for the stressor generator, the stressor generator also receives an electrical signal from one of the host interface slots and generates the stressed electrical signal that is output to at least one of the host interface slots during a loop-back mode for the stressor generator.

12. The universal tester of claim 11, wherein at least some of the communication lanes connected from the stressor generator to the first host interface slot are connected to at least some of the communication lanes connected from the stressor generator to the second host interface slot.

13. The universal tester of claim 11, wherein the stressed electrical signal is generated by injecting Gaussian noise into the received unstressed electrical signal, injecting sinusoidal jitter into the received unstressed electrical signal, simulating an introduction of inter-symbol interference and a limited bandwidth channel for the received unstressed electrical signal, and adjusting a vertical eye closure of the received unstressed electrical signal.

14. The universal tester of claim 11, wherein the universal tester:
tests the host under test in either an electrical test mode of operation or an optical test mode of operation; and
operates in either the pass-through mode or the loop-back mode for the stressor generator.

15. The universal tester of claim 11, wherein the second pluggable host card includes an electrical-optical conversion block to perform electrical-to-optical signal conversion and optical to-electrical signal conversion.

16. The universal tester of claim 11, wherein the universal tester comprises a signal processor that includes the stressor generator, the signal processor coupled to the first connector, the signal processor also connected to the host interface slot via at least 2Y electrical communication lanes with at least Y electrical communication lanes for transmission of signals from the signal processor to the host interface slot and with at least Y electrical communication lanes for transmission of signals from the host interface slot to the signal processor.

17. The universal tester of claim 11, wherein the universal tester comprises a signal processor that includes the stressor generator and a signal aggregator, the signal processor coupled to the first connector, the signal processor connected to the host interface slot via at least 2Y electrical communication lanes with at least Y electrical communication lanes for transmission of signals from the signal processor to the host interface slot and with at least Y electrical communication lanes for transmission of signals from the host interface slot to the signal processor, wherein the signal aggregator receives X approximately 25 Gb/s signals via the first connector and converts the X approximately 25 Gb/s signals to Y approximately 10 Gb/s signals to be provided to the host interface slot via the Y electrical communication lanes, with each of the Y approximately 10 Gb/s signals to be provided via one of the Y electrical communication lanes.

18. The universal tester of claim 11, wherein the universal tester comprises a signal processor that includes the stressor generator and a signal aggregator, the signal processor coupled to the first connector and the host interface slot via a plurality of electrical communication lanes, wherein the signal aggregator receives two approximately 25 Gb/s signals via the first connector and converts the two approximately 25 Gb/s signals to four approximately 10 Gb/s signals to be provided to the host interface slot via the at least some of the electrical communication lanes, with each of the four approximately 10 Gb/s signals to be provided via one of the electrical communication lanes.

19. The universal tester of claim 11, wherein the universal tester comprises a signal processor that includes the stressor generator and a signal aggregator, the signal processor coupled to the first connector and the host interface slot via a plurality of electrical communication lanes, wherein the signal aggregator receives four approximately 25 Gb/s signals via the first connector and converts the four approximately 25 Gb/s signals to ten approximately 10 Gb/s signals to be provided to the host interface slot via the at least some of the electrical communication lanes, with each of the ten approximately 10 Gb/s signals to be provided via one of the electrical communication lanes.

20. The universal tester of claim 11, wherein the universal tester comprises a signal processor that includes the stressor generator and a signal aggregator, the signal processor coupled to the first connector and the host interface slot via a plurality of electrical communication lanes, wherein the signal aggregator converts X approximately 25 Gb/s signals received via the first connector to Y approximately 10 Gb/s signals to be provided to the host interface slot via the at least some of the electrical communication lanes, and converts Y approximately 10 Gb/s signals received from the host interface slot to X approximately 25 Gb/s signals to be provided to the first connector.

21. The universal tester of claim 12, wherein the second host interface slot is connected to a third pluggable host card that is compatible with the second pluggable module standard during an electrical test mode of operation to provide a stressed electrical signal to the host under test; and wherein the second host interface slot is connected to a fourth pluggable host card that is compatible with the second pluggable module standard during an optical test mode of the fourth pluggable host card including an electrical-to-optical signal conversion block to convert a stressed electrical signal to a stressed optical signal that is provided to the host under test.

22. A universal tester comprising:

a first host interface slot compatible with a first pluggable module standard and connected to a first pluggable host card having at least a connector compatible with the first pluggable module standard to provide either a stressed electrical signal or a stressed optical signal to a host under test;

a second host interface slot compatible with a second pluggable module standard and connected to a second pluggable host card having at least a connector compatible with the second pluggable module standard to provide either a stressed electrical signal or a stressed optical signal to a host under test; and a stressor generator coupled via a first set of communication lanes to the first host interface slot, and the stressor generator also being coupled via a second set of communication lanes to the second host interface slot, wherein the stressor generator receives an electrical signal from a first connector and generates the stressed electrical signal that is output to at least one of the host interface slots during a pass-through mode for the stressor generator, the stressor generator also receives an electrical signal from one of the host interface slots and generates the stressed electrical signal that is output to at least one of the host interface slots during a loop-back mode for the stressor generator, and wherein at least some of the first set communication lanes are connected to at least some of the second set of communication lanes.

23. The universal tester of claim 22, wherein the stressed electrical signal is generated by injecting Gaussian noise into the received unstressed electrical signal, injecting sinusoidal jitter into the received unstressed electrical signal, simulating an introduction of inter-symbol interference and a limited bandwidth channel for the received unstressed electrical signal, and adjusting a vertical eye closure of the received unstressed electrical signal.

24. The universal tester of claim 22, wherein the universal tester:

tests the host under test in either an electrical test mode of operation or an optical test mode of operation; and operates in either the pass-through mode or the loop-back mode for the stressor generator.

25. The universal tester of claim 22, wherein the second pluggable host card includes an electrical-optical conversion block to perform electrical-to-optical signal conversion and optical-to-electrical signal conversion.

26. The universal tester of claim 22, wherein the universal tester comprises a signal processor that includes the stressor generator, the signal processor coupled to the first connector, the signal processor also connected to the host interface slot via at least 2Y electrical communication lanes with at least Y electrical communication lanes for transmission of signals from the signal processor to the host interface slot and with at least Y electrical communication lanes for transmission of signals from the host interface slot to the signal processor.

27. The universal tester of claim 22, wherein the universal tester comprises a signal processor that includes the stressor generator and a signal aggregator, the signal processor coupled to the first connector, the signal processor connected to the host interface slot via at least 2Y electrical communication lanes with at least Y electrical communication lanes for transmission of signals from the signal processor to the host interface slot and with at least Y electrical communication lanes for transmission of signals from the host interface slot to the signal processor, wherein the signal aggregator receives X approximately 25 Gb/s signals via the first connector and converts the X approximately 25 Gb/s signals to Y approximately 10 Gb/s signals to be provided to the host interface slot via the Y electrical communication lanes, with each of the Y approximately 10 Gb/s signals to be provided via one of the Y electrical communication lanes.

28. The universal tester of claim 22, wherein the universal tester comprises a signal processor that includes the stressor generator and a signal aggregator, the signal processor coupled to the first connector and the host interface slot via a plurality of electrical communication lanes, wherein the signal aggregator receives two approximately 25 Gb/s signals via the first connector and converts the two approximately 25 Gb/s signals to four approximately 10 Gb/s signals to be provided to the host interface slot via the at least some of the electrical communication lanes, with each of the four approximately 10 Gb/s signals to be provided via one of the electrical communication lanes.

29. The universal tester of claim 22, wherein the universal tester comprises a signal processor that includes the stressor generator and a signal aggregator, the signal processor coupled to the first connector and the host interface slot via a plurality of electrical communication lanes, wherein the signal aggregator receives four approximately 25 Gb/s signals via the first connector and converts the four approximately 25 Gb/s signals to ten approximately 10 Gb/s signals to be provided to the host interface slot via the at least some of the electrical communication lanes, with each of the ten approximately 10 Gb/s signals to be provided via one of the electrical communication lanes.

30. The universal tester of claim 22, wherein the universal tester comprises a signal processor that includes the stressor generator and a signal aggregator, the signal processor coupled to the first connector and the host interface slot via a plurality of electrical communication lanes, wherein the signal aggregator converts X approximately 25 Gb/s signals received via the first connector to Y approximately 10 Gb/s signals to be provided to the host interface slot via the at least some of the electrical communication lanes, and converts Y approximately 10 Gb/s signals received from the host interface slot to X approximately 25 Gb/s signals to be provided to the first connector.

31. The universal tester of claim 22, wherein the second host interface slot is connected to a third pluggable host card that is compatible with the second pluggable module standard during an electrical test mode of operation to provide a stressed electrical signal to the host under test; and wherein the second host interface slot is connected to a fourth pluggable host card that is compatible with the second pluggable module standard during an optical test mode of the fourth pluggable host card including an electrical-to-optical signal conversion block to convert a stressed electrical signal to a stressed optical signal that is provided to the host under test.

* * * * *